United States Patent
Ahn

(10) Patent No.: US 7,378,319 B2
(45) Date of Patent: May 27, 2008

(54) METHOD OF FORMING DOUBLE GATE DIELECTRIC LAYERS AND SEMICONDUCTOR DEVICE HAVING THE SAME

(75) Inventor: Yong Soo Ahn, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 149 days.

(21) Appl. No.: 11/319,531

(22) Filed: Dec. 29, 2005

(65) Prior Publication Data

US 2006/0138571 A1   Jun. 29, 2006

(30) Foreign Application Priority Data

Dec. 29, 2004   (KR) .................. 10-2004-0114679

(51) Int. Cl.
*H01L 21/8234* (2006.01)
(52) U.S. Cl. ............. 438/275; 438/765; 438/769; 438/770; 257/E21.625; 257/E21.639
(58) Field of Classification Search ......... 438/765; 257/E21.4, E21.615
See application file for complete search history.

(56) References Cited

U.S. PATENT DOCUMENTS

| | | | | |
|---|---|---|---|---|
| 6,436,771 B1 * | 8/2002 | Jang et al. | ............... | 438/275 |
| 6,475,862 B1 * | 11/2002 | Ando | ............... | 438/264 |
| 2003/0045080 A1 * | 3/2003 | Visokay et al. | ............. | 438/591 |

* cited by examiner

*Primary Examiner*—Michael Lebentritt
*Assistant Examiner*—Cheung Lee
(74) *Attorney, Agent, or Firm*—Finnegan, Henderson, Farabow, Garrett, & Dunner, L.L.P.

(57) ABSTRACT

A method of forming double gate dielectric layers composed of an underlying oxide layer and an overlying oxy-nitride layer is provided to prevent degradation of gate dielectric properties due to plasma-induced charges. In the method, the oxide layer is thermally grown on a silicon substrate under oxygen gas atmosphere to have a first thickness, and then the oxy-nitride layer is thermally grown on the oxide layer under nitrogen monoxide gas atmosphere to have a second thickness smaller than the first thickness. The substrate may have a high voltage area and a low voltage area, and the oxide layer may be partially etched in the low voltage area so as to have a reduced thickness. The oxy-nitride layer behaves like a barrier, blocking the inflow of the plasma-induced charges.

4 Claims, 4 Drawing Sheets

METHOD OF FORMING DOUBLE GATE DIELECTRIC LAYERS AND SEMICONDUCTOR DEVICE HAVING THE SAME

CROSS REFERENCE TO RELATED APPLICATIONS

This U.S. non-provisional application claims priority under 35 U.S.C. §119 from Korean Patent Application No. 2004-114679, which was filed in the Korean Intellectual Property Office on Dec. 29, 2004, the contents of which are incorporated by reference herein in its entirety.

BACKGROUND OF THE INVENTION

1. Field of the Invention

The present invention relates generally to semiconductor technology and, more particularly, to a method of forming double gate dielectric layers composed of an underlying oxide layer and an overlying oxy-nitride layer, and a semiconductor device having double gate dielectric layers.

2. Description of the Related Art

A dramatic trend toward scaling down of a transistor in integrated circuit chips continuously requires a much thinner gate dielectric layer. The ultrathin gate dielectric layer may, however, confront many problems to be solved. A decrease in gate oxide integrity (GOI) property is one of such problems. This problem related to GOI property may be caused by plasma-induced damage that may often occur during several processes such as gate etch, metal etch, via etch, and gap fill CVD that follow a gate oxidation process.

In order to improve GOI property, an oxy-nitride layer has been used for the gate dielectric layer. FIG. 1 shows, in a cross-sectional view, a conventional semiconductor device having the oxy-nitride gate dielectric layer.

Referring to FIG. 1, a field region 11 having STI (shallow trench isolation) structure is formed in a silicon substrate 10 to define an active region. A well region 12 is formed in the substrate 10, and source/drain regions 15 having LDD (lightly doped drain) structure are formed in the active region of the substrate 10. The oxy-nitride gate dielectric layer 13 is formed between the source/drain regions 15 on the substrate 10, and further, a gate electrode 14 is formed thereon.

Normally the oxy-nitride gate dielectric layer 13 is formed using nitrogen monoxide (NO) gas during a typical gate oxidation process. Such conventional method produces an oxy-nitride layer within an oxide layer. However, this oxy-nitride layer may be distributed with very poor uniformity, and further, nitrogen atoms in the oxy-nitride layer may act as impurities that cause degradation in GOI property. For example, with enough voltage applied, plasma-induced charges trapped in the gate dielectric layer 13 eventually succumb to the electrical pressure and thereby electrons flow toward the p-type well region 12. Such a breakdown voltage may be much lowered when there is a poorly uniform layer or undesirable impurity in the gate dielectric layer.

FIG. 2 illustrates a breakdown phenomenon in the non-uniform oxy-nitride gate dielectric layer. Referring to FIG. 2, electrons 20 induced by plasma are trapped in the gate dielectric layer 13 underneath the gate electrode 14 and then flow into the p-type well 12 at the breakdown voltage. Unfortunately, this phenomenon due to plasma-induced charge may deteriorate characteristics of the semiconductor device and also drop yield and reliability of the device.

SUMMARY OF THE INVENTION

Exemplary, non-limiting embodiments of the present invention provide a method of forming double gate dielectric layers so as to prevent degradation of gate dielectric properties due to plasma-induced charges and a semiconductor device having double gate dielectric layers.

According to an exemplary embodiment of the present invention, the method comprises thermally growing an oxide layer on a silicon substrate under oxygen gas atmosphere to have a first thickness, and thermally growing an oxy-nitride layer on the oxide layer under nitrogen monoxide gas atmosphere to have a second thickness smaller than the first thickness.

In the method, the substrate may have a high voltage area and a low voltage area. Here, the method may further comprise, after growing the oxide layer, the step of partially etching the oxide layer in the low voltage area so as to have a reduced thickness.

The first thickness of the oxide layer may be about 50~70 Å, and the second thickness of the oxy-nitride layer may be about 5~15 Å. Additionally, the reduced thickness of the oxide layer may be about 20~30 Å.

According to another exemplary embodiment of the present invention, the semiconductor device comprises a silicon substrate having a field region defining an active region, source/drain regions formed in the active region of the substrate, double gate dielectric layers formed between the source/drain regions on the substrate and including an underlying oxide layer having a first thickness and an overlying oxy-nitride layer having a second thickness smaller than the first thickness, and a gate electrode formed on the double gate dielectric layers.

DETAILED DESCRIPTION OF EXEMPLARY EMBODIMENTS OF THE INVENTION

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It is noted that well-known structures and processes are not described or illustrated in detail to avoid obscuring the essence of the present invention. It is also noted that the figures are not drawn to scale.

Figure 1:
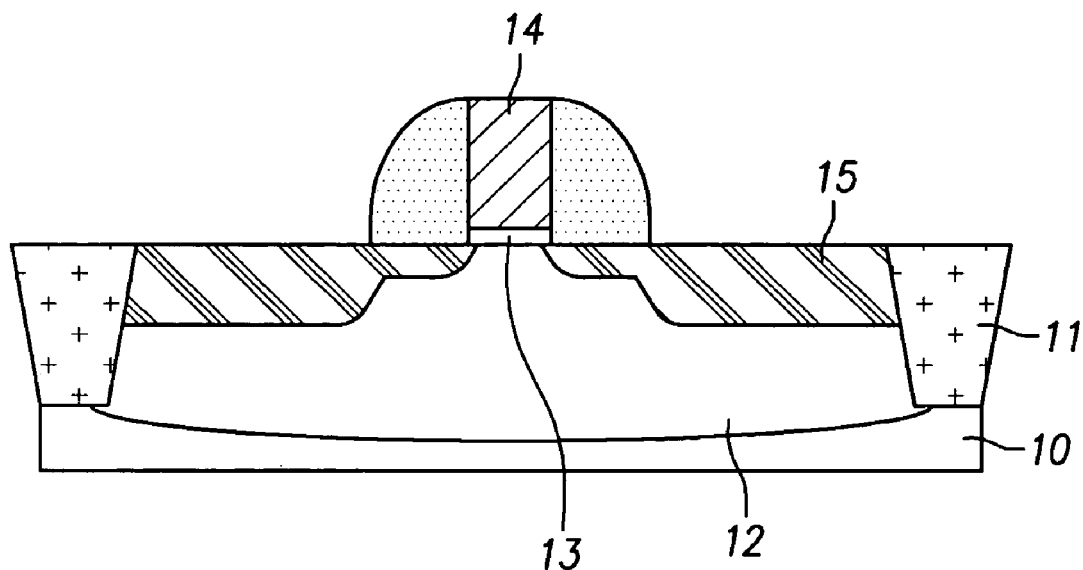
FIG. 1 is a cross-sectional view showing a conventional semiconductor device having an oxy-nitride gate dielectric layer.
Figure 2:
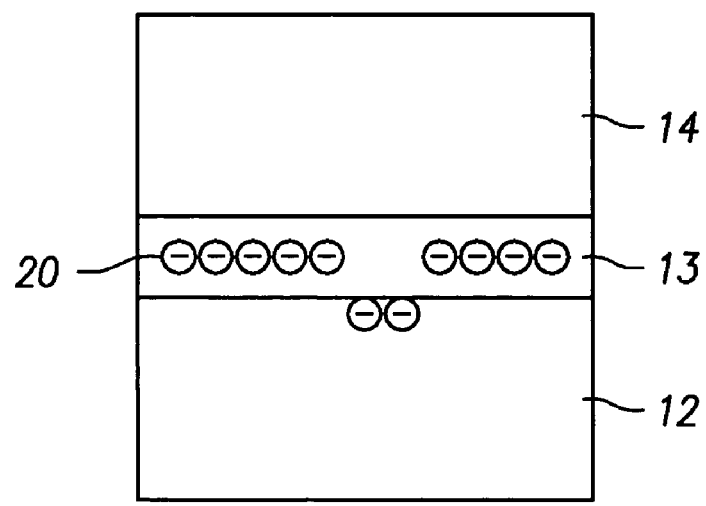
FIG. 2 illustrates a breakdown phenomenon in the non-uniform oxy-nitride gate dielectric layer.
Figure 3A:
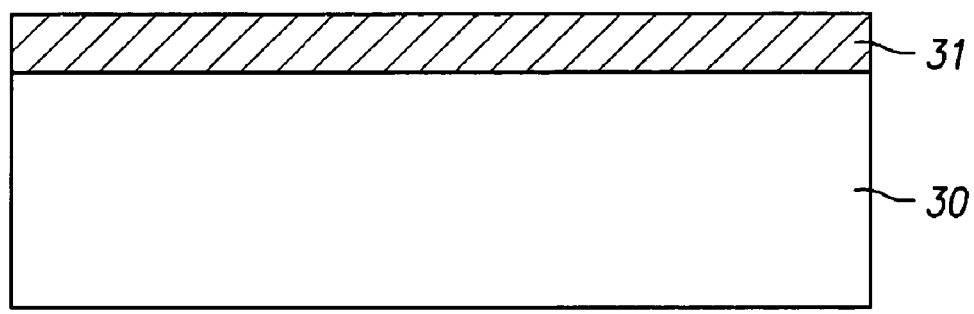
FIGS. 3A to 3C are cross-sectional views showing a method of forming double gate dielectric layers of a semiconductor device in accordance with an exemplary embodiment of the present invention.
Figure 3B:
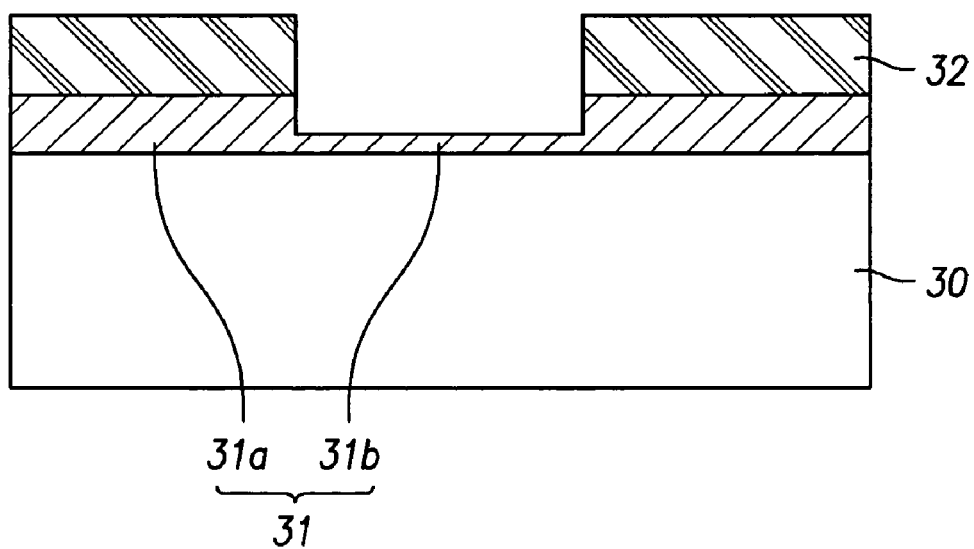
Figure 3C:
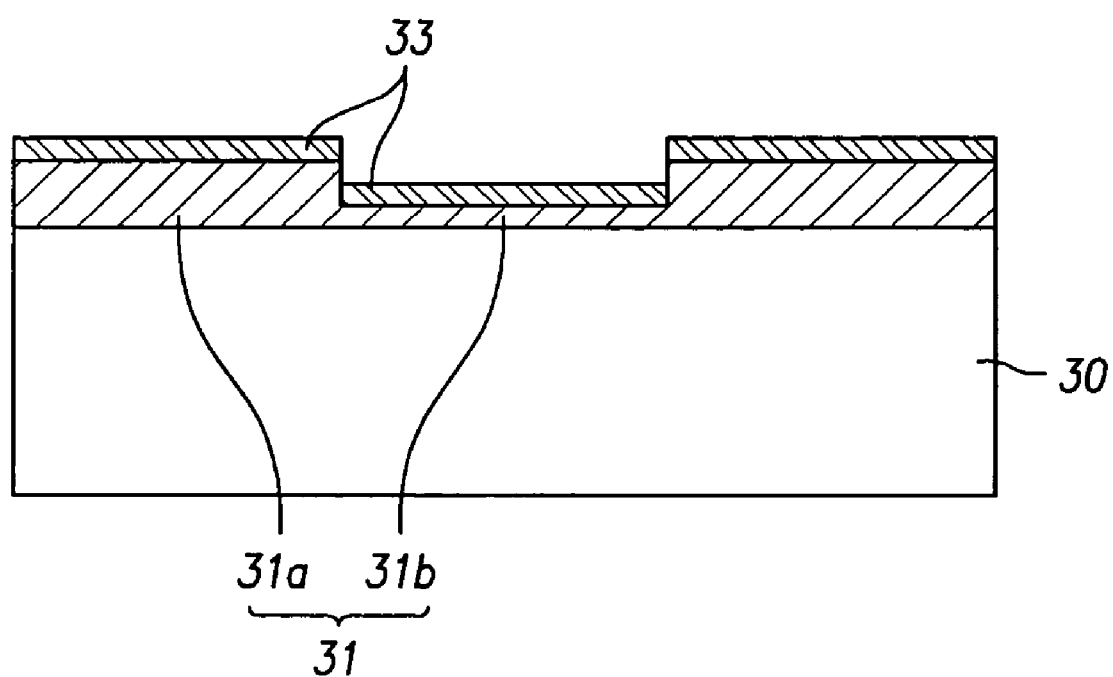

FIGS. 3A to 3C are cross-sectional views showing a method of forming double gate dielectric layers of a semiconductor device in accordance with an exemplary embodiment of the present invention.

Referring to FIG. 3A, an oxide layer 31 is formed on a silicon substrate 30. The oxide layer 31 may be thermally grown to a thickness of about 50~70 Å under oxygen gas atmosphere at a temperature of about 750~850° C.

Next, referring to FIG. 3B, the oxide layer 31 is selectively coated with a photoresist pattern 32. Specifically, the photoresist pattern 32 covers only a first part 31a of the oxide layer 31 and exposes a second part 31b of the oxide layer 31. The first and second parts 31a and 31b of the oxide layer 31 correspond to a high voltage area and a low voltage area, respectively. While the photoresist pattern 32 masks the high voltage area, the low voltage part 31b of the oxide layer 31 is partially etched to reduce the thickness. Hence, the high voltage part 31a of the oxide layer 31 maintains an initial thickness of about 50~70 Å, whereas the low voltage part 31b becomes thinner to a thickness of about 20~30 Å. Thereafter, the photoresist pattern 32 is stripped.

Next, an oxy-nitride layer 33 is uniformly formed on the oxide layer 31. The oxy-nitride layer 33 may be thermally grown to a thickness of about 5~15 Å under nitrogen monoxide gas atmosphere at a temperature of about 750~850° C. Therefore, resultant double gate dielectric layers are composed of the underlying oxide layer 31 and the overlying oxy-nitride layer 33. The whole thickness of the gate dielectric layers is about 55~85 Å in the high voltage area and 25~45 Å in the low voltage area.

Figure 4:
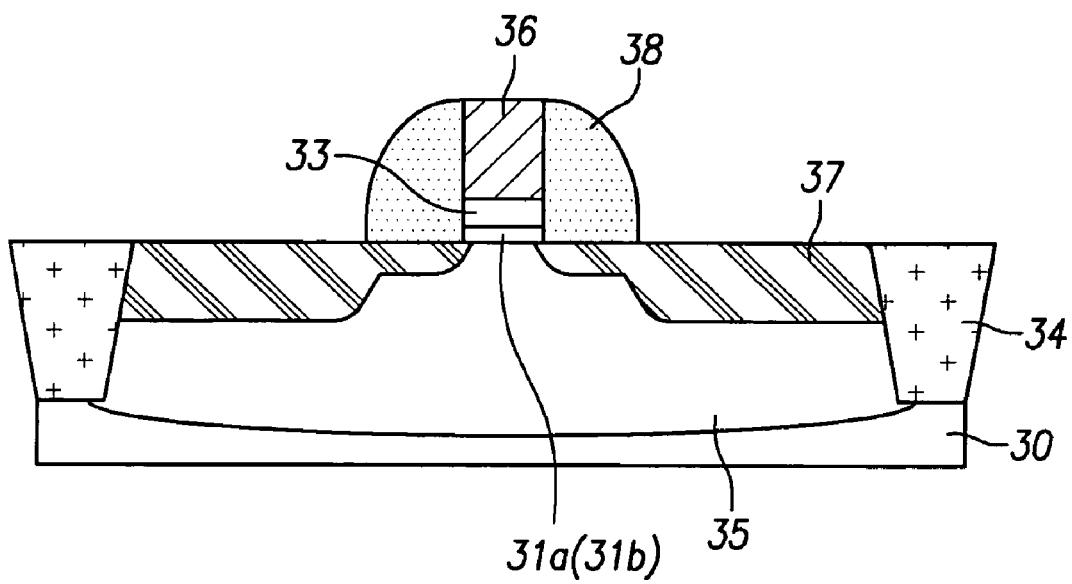
FIG. 4 is a cross-sectional view showing a semiconductor device having double gate dielectric layers in accordance with another exemplary embodiment of the present invention.

Next, normal subsequent processes are performed in sequence to fabricate a semiconductor device. FIG. 4 shows, in a cross-sectional view, the semiconductor device having double gate dielectric layers in accordance with another exemplary embodiment of the present invention.

Referring to FIG. 4, a silicon substrate 30 has a field region 34 with STI (shallow trench isolation) structure defining an active region. A well region 35 is formed in the substrate 30, and source/drain regions 37 having LDD (lightly doped drain) structure are formed in the active region of the substrate 30. The above discussed double gate dielectric layers 31a (or 31b) and 33 are formed between the source/drain regions 37 on the substrate 30. Additionally, a gate electrode 36 is formed on the double gate dielectric layers 31a (or 31b) and 33, and dielectric spacers 38 are formed on sidewalls of the gate electrode 36.

For clarity, illustrated structure represents only the high voltage area or the low voltage area. However, the high and low voltage areas have similar structures except for the thickness of the double gate dielectric layers.

Figure 5:
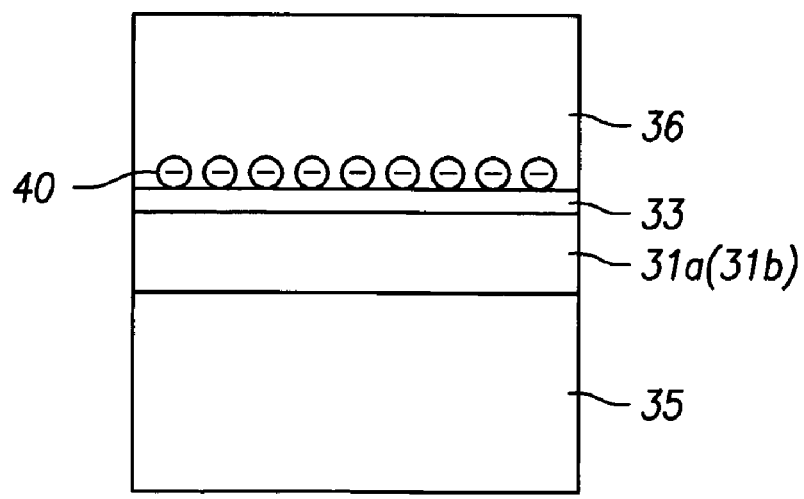
FIG. 5 illustrates plasma-induced charges blocked by the double gate dielectric layers.

The double gate dielectric layers of the invention may be effective in preventing degradation of gate dielectric properties due to plasma-induced charges. FIG. 5 illustrates plasma-induced charges blocked by the double gate dielectric layers.

Referring to FIG. 5, the oxy-nitride layer 33 that is formed on the oxide layer 31a (or 31b) in a separate process may have improved uniformity. In the subsequent processes, the oxy-nitride layer 33 behaves like a barrier, blocking the inflow of the plasma-induced charges 40. Therefore, the oxy-nitride layer 33 not only prevents degradation of gate dielectric properties due to plasma-induced charges, but also enhances characteristics, yield and reliability of the device.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method of forming double gate dielectric layers of a semiconductor device, the method comprising:
    thermally growing an oxide layer on a silicon substrate having a high voltage area and a low voltage area under oxygen gas atmosphere, the oxide layer having a first thickness;
    partially etching a portion of the oxide layer formed on the low voltage area so that the portion of the oxide layer formed on the low voltage area has a reduced thickness; and
    thermally growing an oxy-nitride layer on the oxide layer under nitrogen monoxide gas atmosphere, the oxy-nitride layer having a second thickness smaller than the first thickness.

2. The method of claim 1, wherein the first thickness of the oxide layer is about 50~70 Å.

3. The method of claim 1, wherein the second thickness of the oxy-nitride layer is about 5~15 Å.

4. The method of claim 1, wherein the reduced thickness of the oxide layer is about 20~30 Å.

* * * * *